United States Patent [19]

Archambault et al.

[11] 4,149,126

[45] Apr. 10, 1979

[54] DIODE AND DIELECTRIC RESONATOR MICROWAVE OSCILLATOR

[75] Inventors: Yves Archambault; Didier Kaminsky, both of Paris, France

[73] Assignee: Thomson-CSF, Paris, France

[21] Appl. No.: 864,550

[22] Filed: Dec. 27, 1977

[30] Foreign Application Priority Data

Dec. 31, 1976 [FR] France .................. 76 39717

[51] Int. Cl.² .............................................. H03B 7/14
[52] U.S. Cl. ...................................... 331/56; 331/99; 331/107 R; 331/107 G
[58] Field of Search ................ 331/55, 56, 96, 107 G, 331/101, 107 R, 99

[56] References Cited
U.S. PATENT DOCUMENTS

| | | | |
|---|---|---|---|
| 3,252,112 | 5/1966 | Hauer | 331/56 |
| 3,378,789 | 4/1968 | Gerlach | 331/56 |
| 3,605,034 | 9/1971 | Rucker | 331/56 |
| 3,628,171 | 12/1971 | Kurokawa | 331/56 |
| 3,662,285 | 5/1972 | Rucker | 331/56 |
| 3,714,605 | 1/1973 | Grace et al. | 331/56 |
| 3,883,824 | 5/1975 | Weiner | 331/107 G |
| 4,008,446 | 2/1977 | Hirai | 331/101 |
| 4,079,341 | 3/1978 | Linn et al. | 331/96 |

Primary Examiner—John Kominski
Attorney, Agent, or Firm—Roland Plottel

[57] ABSTRACT

A microwave oscillator in which the power supplied by 2N microwave diodes such as avalanche or Gunn effect diodes is added. The diodes are connected together in two by sections of strip lines which enables magnetic coupling between these diodes and a dielectric resonator, with the diodes in each couple operating in phase opposition.

11 Claims, 4 Drawing Figures

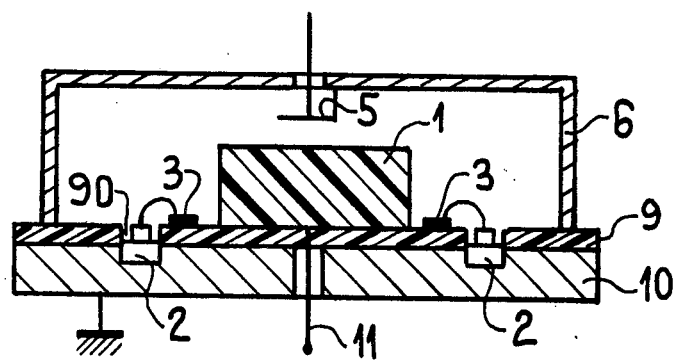
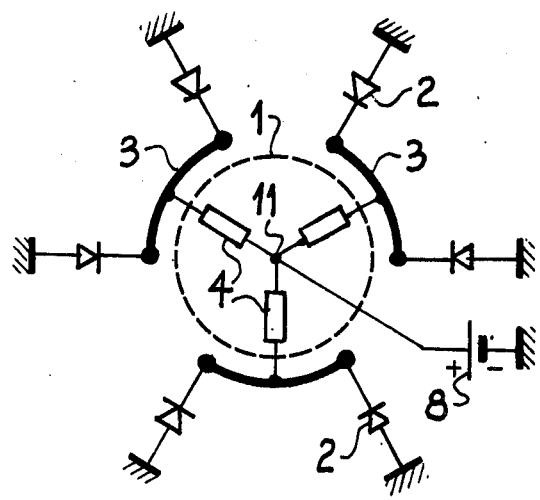

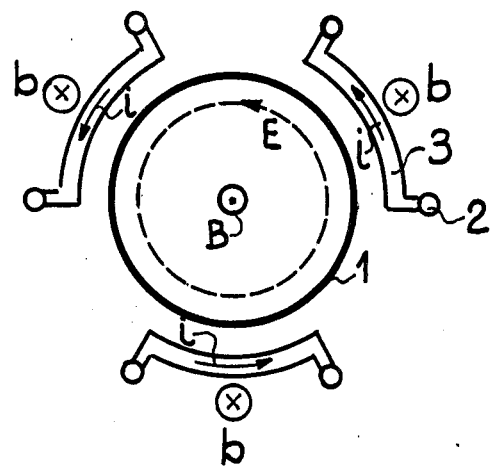
FIG_3
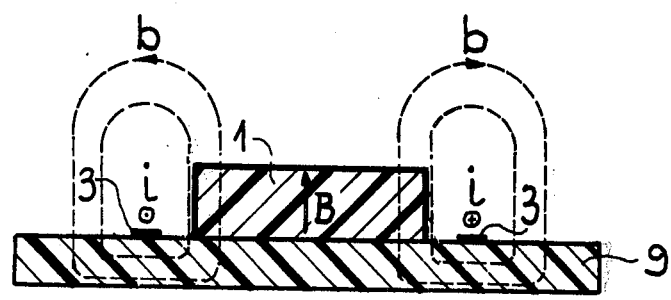
FIG_4

DIODE AND DIELECTRIC RESONATOR MICROWAVE OSCILLATOR

The invention covers the microwave oscillator field. It covers more especially the combining of active microwave components such as avalanche or Gunn effect diodes with a dielectric resonator in order to add the power supplied by these components.

It is known that it is difficult to assemble several components of this type in order to add their power at microwave frequencies without causing power losses in the form of harmonics or waves produced by parasite operating modes.

Different known systems have attempted to solve this problem. Among them may be cited:

the assembly of two microwave diodes in opposition across a wave guide, with the diodes operating in phase opposition and operation in phase being prevented by the internal admittance of the diode polarizing circuit; this system is described in U.S. Pat. Ser. No. 742,878.

the coupling of microwave diodes to a cylindrical metallic cavity resonating in the TM 010 mode; all the diodes oscillate in phase and the other resonance modes are prevented by absorbing loads placed in parallel in the polarizing circuit of each diode; such a system is described in the American publication, I.E.E.E. Transactions on Microwave Theory and Techniques (July 1976, pages 483 to 485).

The present invention covers a microwave oscillator with an improved output which is most compact and easy to make.

According to the present invention, there is provided a diode microwave oscillator comprising said diodes in even number, (2N) said diodes being semiconducting diodes with a negative resistance at high frequencies; a dielectric resonator, and a plurality of (N) lines with diodes in in groups of two, each of said lines providing coupling between the two diodes of the corresponding group and said resonator, the diodes in each group operating in phase opposition.

For a better understanding of the invention and to show how it can be carried into effect, reference will be made to the following description and the attached drawings which show:

in FIG. 1, an embodiment of the device in accordance with the invention seen in section, in FIG. 2, the electrical schematic of the diode assembly used in the device in accordance with the invention, in FIGS. 3 and 4, schematics showing field and current lines in the same device.

On these various FIGURES, the same references concern the same elements.

The device in accordance with the invention, such as is shown in FIG. 1 as an example, contains:

a metallic base 10 which is held at the reference potential (ground), a dielectric material 9 in the form of a layer deposited on base 10 for example, a dielectric block 1 in the form of a flat, right cylinder, i.e. one whose thickness is of the order of size of the cylinder radius or a fraction of it. Cylinder 1 is deposited on dielectric 9 and forms a resonator. This resonator is made, for preference, from a material with a large dielectric constant such as a ceramic, avalanche diodes 2, in even numbers 2N (here 2N = 6), placed in the vicinity and on the periphery of resonator 1, each one being in an opening 90 made in dielectric 9 and metallic base 10. These diodes are connected, all in the same direction, to ground through metallic base 10. The other terminal of diodes 2 is connected to the metallic lines 3, which are deposited on dielectric 9 for example as microstrip transmission lines, in accordance with the schematic described below in FIG. 2, a metallic cover 6 placed on dielectric 9 and enclosing diodes 2, lines 3 and resonator 2. The purpose of this cover is to prevent radiation losses from resonator 1.

The device in FIG. 1 also has a central conductor 11, which provides the polarizing voltage for diodes 2 as shown below in FIG. 2, and an outlet 5 for the microwave power produced by the device. This outlet 5 can be formed as shown in section on the Figure by a loop parallel to the bases of resonator 1.

FIG. 2 is a schematic view of the device in FIG. 1 from above and shows more especially the electrical assembly of diodes 2.

The 2N diodes 2 are connected in groups of two by N sections 3 of circular line. The various sections of line 3 are connected through an impedance 4 to a central connection which is the diode polarizing conductor 11. For this purpose this conductor is connected to the positive terminal of a voltage source 8, the negative terminal of this source forming the reference potential (ground) so that diodes 2 may be polarized in opposition.

The nature of impedances 4 is specified below but it may be noted now that they must allow the passage of direct current. To make them, they are deposited, for example, in the form of layers on the surface of dielectric 9, using a known method, resonator 1 then being placed over the whole.

For clarity in the schematic, the outline of resonator 1 has also been shown dotted.

In FIGS. 1 and 2, diodes 2 of the avalanche type and the corresponding polarization have been described. Of course, these may be replaced by any active dipole with a negative resistance at microwave frequencies provided that the D.C. polarizing circuit is adapted. In particular they may be replaced by Gunn effect diodes.

As far as operation of this device is concerned, if two diodes 2 connected by the same line 3 are considered, it can be seen that they are in parallel from the point of view of the D.C. polarizing current. But, in one of the possible operating modes of the device (the type called "push-pull") which is the operating mode required, they are in series from the point of view of the high frequency current. Calculations show that this particular arrangement, in the case in which all diodes 2 are identical, causes the elimination of even harmonics. The diodes oscillate therefore in this mode in phase opposition. These diodes, which are alternately at a positive and negative high frequency voltage, deliver a current in the same direction in lines 3 which allow magnetic coupling in the fundamental mode (TE 01$\delta$) of resonator 1 as shown in FIGS. 3 and 4.

FIG. 3 shows a view from above of certain elements of the device in FIG. 1, resonator 1 and the N sections of line 3 connecting two by two the 2N diodes 2.

The direction of the current i flowing through lines 3 has been shown at a given instant: it is the same for all the lines (on the Figure the trigonometric direction) and the magnetic field b they produce whose lines of force are loops normal to the plane of the Figure.

The fundamental mode TE 01δ of the resonator has been shown by a line of force of the circular electric field E and a line of force of the magnetic field B which is normal to the plane of the Figure.

FIG. 4 shows, both schematically and in section, certain elements of FIG. 1, resonator 1, dielectric 9 and two lines 3. In this FIGURE magnetic field b produced by current i passing in lines 3 has been shown. It can be seen that it couples with mode TE 01δ of resonator 1, whose magnetic field is shown by arrow B.

In the steady state, as was explained above, the operating mode required for the device described in FIGS. 1 and 2 is the one in which the phase shift of each of diodes 2 with respect to the adjacent diode is $\pi$, the mode for which the high frequency current circulating in the connections joining lines 3 to polarizing source 8 is zero.

It is necessary to eliminate the other resonant modes which are possible in particular by the fact that the frequency band in which the avalanche or Gunn effect diodes act as a negative resistance is very wide (about an octave).

The resonance modes nearest to the fundamental are the TE n1δ modes for a flat resonator. However, for these modes, the sum of the high frequency currents in two consecutive diodes is not zero. To prevent oscillation in these modes, impedances 4 (FIG. 2) are placed in the polarizing connections. They must be such that they allow the D.C. to pass but modify the impedance seen by the diodes at high frequency. This can be obtained with impedances containing an imaginary part which adds to that of the diodes. The choice of impedance depends therefore on the characteristics of the diodes used.

Hence, with a device such as the one described, it is possible to combine a large number of active elements to constitute an oscillator producing a power very much higher than that which can be obtained with a single, solid state, active element and the assembly does not reduce the output of each of the active elements used while being more compact and easy to make.

What is claimed is:

1. A diode microwave oscillator comprising said diodes in even number (2N), said diodes being semiconducting diodes with a negative resistance at high frequencies; a dielectric resonator, and a plurality of (N) lines with diodes in in groups of two, each of said lines providing coupling between the two diodes of the corresponding group and said resonator, the diodes in each group operating in phase opposition.

2. An oscillator as claimed in claim 1, wherein said diodes are identical.

3. An oscillator as claimed in claim 1, wherein said diodes are from the class of avalanche and Gunn effect types.

4. An oscillator as claimed in claim 1, wherein said resonator is in the shape of a right cylinder, whose height is within the limits of about the size of its radius to a fraction of this and which operates in the mode TE 01δ.

5. An oscillator as claimed in claim 1, wherein said resonator is in the shape of a right cylinder, whose height is about a fraction of the size of its radius and which operates in the mode TE 01δ.

6. An oscillator as claimed in claim 1, wherein said resonator is made of a material with a high dielectric constant.

7. An oscillator as claimed in claim 6, wherein said resonator is made of a ceramic material.

8. An oscillator as claimed in claim 4, wherein said lines are sections of a roughly circular line which are placed around the said resonator to give magnetic coupling of the diodes with the resonator.

9. An oscillator as claimed in claim 5, wherein said lines are sections of a roughly circular line which are placed around the said resonator to give magnetic coupling of the diodes with the resonator.

10. An oscillator as claimed in claim 1, wherein said diodes are connected to a polarizing voltage source through said lines, each of said lines being separately connected to a feed conductor from said polarizing voltage source.

11. An oscillator as claimed in claim 10, wherein said lines are connected to the polarizing conductor through an impedance which allows the D.C. to pass but attenuates the H.F. current.

* * * * *